United States Patent
Murakami (10) Patent No.: US 11,400,520 B2
(45) Date of Patent: Aug. 2, 2022

(54) SURFACE-COATED CUTTING TOOL

(71) Applicant: MITSUBISHI MATERIALS CORPORATION, Tokyo (JP)

(72) Inventor: Akihiro Murakami, Naka-gun (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 31 days.

(21) Appl. No.: 16/800,759

(22) Filed: Feb. 25, 2020

(65) Prior Publication Data

US 2020/0269324 A1  Aug. 27, 2020

(30) Foreign Application Priority Data

Feb. 27, 2019 (JP) .............................. JP2019-033691

(51) Int. Cl.
  *C23C 16/36* (2006.01)
  *C23C 28/00* (2006.01)
  *B23B 27/14* (2006.01)

(52) U.S. Cl.
  CPC ........ *B23B 27/148* (2013.01); *B23B 2228/10* (2013.01); *C23C 16/36* (2013.01)

(58) Field of Classification Search
  CPC .... B23B 27/148; B23B 2228/10; C23C 16/36
  See application file for complete search history.

(56) References Cited

FOREIGN PATENT DOCUMENTS

| JP | 2017-144548 A |   | 8/2017 |   |
|----|---------------|---|--------|---|
| JP | 2017144548 A  | * | 8/2017 |   |
| JP | 2018-024038 A |   | 2/2018 |   |
| JP | 2018024038 A  | * | 2/2018 | ............. C23C 16/36 |

OTHER PUBLICATIONS

S. Mahieu et al., "Biaxially aligned titanium nitride thin films deposited by reactive unbalanced magnetron sputtering", *Surface & Coatings Technology* 200, 2006, pp. 2764-2768.

* cited by examiner

*Primary Examiner* — Daniel J. Schleis
*Assistant Examiner* — Kevin C T Li
(74) *Attorney, Agent, or Firm* — Leason Ellis LLP (57) ABSTRACT

This surface-coated cutting tool is a surface-coated cutting tool having a hard coating layer formed on a surface of a tool body in which the hard coating layer includes at least one orientational Ti compound layer made of a rock salt-type cubic crystal structure containing 35 at % or more of Ti and 30 at % or more of N, a maximum TC value (TC max) is 2.5 or more, and, in the case of measuring crystal orientations, in a plane parallel to the surface of the tool body, of crystal grains for which a plane having the maximum TC value is perpendicular to the surface of the tool body, a full width at half maximum of $\phi$ scan is 30° or less.

9 Claims, 1 Drawing Sheet

SURFACE-COATED CUTTING TOOL

CROSS-REFERENCE TO RELATED PATENT APPLICATIONS

This application claims the benefit of priority to Japanese Patent Application No. 2019-033691 filed on Feb. 27, 2019, which is incorporated herein by reference in its entirety.

BACKGROUND OF THE INVENTION

Field of the Invention

The present invention relates to a surface-coated cutting tool (hereinafter, referred to the coated tool) which is excellent in terms of chipping resistance and wear resistance in the cutting process of difficult-to-cut materials such as stainless steel and exhibits excellent cutting performance over long-term use.

Description of Related Art

In the related art, generally, coated tools having a hard coating layer formed by deposition on a surface of a base made of tungsten carbide (hereinafter, represented by WC)-based cemented carbide or a titanium carbonitride (hereinafter, represented by TiCN)-based cermet (hereinafter, collectively referred to as the tool body) are known. For the coated tools, there have been a variety of proposals in order to enhance tool performance such as chipping resistance, breakage resistance, peeling resistance, and wear resistance depending on the cutting conditions and kind of work materials.

Particularly, for difficult-to-cut materials such as stainless steel, there has been a strong demand for durability against the occurrence of weld chipping or adhesive wear.

For example, Japanese Unexamined Patent Application, First Publication No. 2017-144548 proposes the following configurations (a) and (b) for a coated tool having a hard coating layer formed on a surface of a tool body made of tungsten carbide-based cementite carbide or a titanium carbonitride-based cermet.

(a) The hard coating layer includes Ti compound layers which are made up of one or more layers selected from a carbide layer, a nitride layer, a carbonitride layer, a carbonate layer, and a carboxynitride layer of Ti, at least one layer of which is a carbonitride layer of Ti, and have a total average layer thickness of 2 to 15 μm.

(b) In at least one carbonitride layer of Ti in the Ti compound layers, the maximum diffraction peak intensity by X-ray diffraction appears in a (200) plane, and the orientation index Tc(200) is 2.0 or more. Furthermore, in a longitudinal section of the Ti compound layer, the area proportion of crystal grains having a columnar vertically long microstructure with an aspect ratio of 5 or more is 70% by area or more. In the Ti compound layers, the layer thicknesses of all of the carbonitride layers of Ti are preferably 4 to 13 μm.

In addition, for the coated tool of Japanese Unexamined Patent Application, First Publication No. 2017-144548, it is considered that, in the high-load and low-speed cutting process of stainless steel in which a large shear force is exerted, due to the presence of the TiCN layer having excellent plastic deformation resistance, the dropping of a TICN crystal grain and the resulting chipping, breakage, and peeling do not occur, and excellent wear resistance is exhibited.

In addition, Japanese Patent Publication No. 2018-24038 proposes the following configurations (a) to (c) for a coated tool having a hard coating layer formed on a surface of a tool body made of WC-based cementite carbide or a TiCN-based cermet. (a) A Ti compound layer including at least nitrogen and carbon is formed on the surface of the tool body. (b) In the case of measuring the concentration of nitrogen in the Ti compound layer in a direction perpendicular to the surface of the tool body in a vicinity of a cutting edge of the tool body, in a range of 0.20 μm from the surface of the tool body toward the Ti compound layer side, the concentration of nitrogen in the Ti compound layer gradually increases as the distance from the tool body increases, and the average concentration gradient is 20 atom %/μm or more and 300 atom %/μm or less. (c) The average concentration of nitrogen in the Ti compound layer formed immediately above the surface of the tool body in the vicinity of the cutting edge is lower than the average concentration of nitrogen in the Ti compound layer formed immediately above the surface of the tool body at a location away from the cutting edge of a flank face by 3 atom % or more.

In addition, according to the coated tool of Japanese Patent Publication No. 2018-24038, it is considered that, in the intermittent cutting process of duplex stainless steel, the weld chipping resistance and the peeling resistance are excellent.

SUMMARY OF THE INVENTION

In the cutting process of difficult-to-cut materials such as stainless steel, there are a number of cases where the service life of a tool ends due to weld chipping and adhesive wear, and, particularly, in recent years, there has been a strong demand for an increase in the service life of a tool in a process in which one pass of cutting and a break is repeated (hereinafter, referred to as the interval cutting process).

However, in the coated tools of the related art described in Japanese Unexamined Patent Application, First Publication No. 2017-144548 and Japanese Patent Publication No. 2018-24038, it is not yet possible to sufficiently suppress the occurrence of weld chipping and the occurrence of adhesive wear in the interval cutting process. That is, still, the service lives of tools are short, and satisfactory cutting performance is not obtained.

Therefore, from the above-described viewpoint, the present inventors carried out intensive studies regarding the mechanism of the occurrence of weld chipping and the occurrence of adhesive wear in order to provide a coated tool being excellent in terms of weld chipping resistance and adhesive wear resistance in the interval cutting process of stainless steel (for example, JIS-SUS304) that is a difficult-to-cut material and consequently obtained the following knowledge.

The present inventors carried out the interval cutting process of stainless steel using a coated tool in which a Ti compound layer such as a TiN layer or a TiCN layer was formed by coating as the hard coating layer, investigated the cutting edge of the coated tool after the process, and consequently found that a component of a work material (for example, a Cr component) diffused into large angle tilt boundaries in the hard coating layer and weld chipping or adhesive wear was caused from the component as an origin. Furthermore, the present inventors found that, in small angle tilt boundaries in the hard coating layer, the component of the work material such as the Cr component diffused to a relatively small extent and weld chipping or adhesive wear was not easily caused.

From this investigation result, the present inventors got an idea of forming a crystal grain microstructure including a number of small angle tilt boundaries as the crystal grain microstructure configuring, in the hard coating layer, particularly, the Ti compound layer. In other words, the present inventors generated a hypothesis that the formation of a crystal grain microstructure having an orientation in which the orientations of crystals configuring the hard coating layer are aligned in a direction perpendicular to the surface of the tool body and in a direction parallel to the surface of the tool body enables the prevention of the diffusion of a component of a work material into crystal grain boundaries in the interval cutting process of stainless steel and, consequently, the extension of the service life to a larger extent than in the related art.

Surface and Coatings Technology 200 (2006) (pp. 2764 to 2768) mainly deals with a technique developed for oxide-based superconducting wire rods and describes nothing about a film formation technique for the hard coating layer in the coated tools, but discloses a technique of forming a TiN film having orientations aligned in a direction perpendicular to the surface of a substrate and in a direction parallel to the surface of the substrate on a stainless steel polycrystalline substrate.

Therefore, the present inventors applied the film formation technique known by Surface and Coatings Technology 200 (2006) (pp. 2764 to 2768) to the film formation of the hard coating layer (particularly, the Ti compound layer) of the coated tools, formed a hard coating layer made of an orientational Ti compound layer with a crystal grain microstructure oriented in a direction perpendicular to the surface of a tool body and in a direction parallel to the surface of the tool body, and obtained a coated tool. As a result of using this coated tool in the interval cutting process of stainless steel, it was found that a component of a work material such as Cr diffused into small angle tilt boundaries in the hard coating layer to a small extent, the occurrence of weld chipping or adhesive wear was suppressed, and excellent chipping resistance and wear resistance were exhibited, and thus the present inventors' hypothesis was verified.

The present invention was made on the basis of the above-described knowledge.

(1) A surface-coated cutting tool of the present invention is a surface-coated cutting tool having a hard coating layer having a total layer thickness of 1 µm or more and 25 µm or less formed on a surface of a tool body made of tungsten carbide-based cemented carbide or a titanium carbonitride-based cermet, in which (a) the hard coating layer includes at least one orientational Ti compound layer which is made of a rock salt-type cubic crystal structure and which has an average layer thickness of 0.1 µm or more and 10 µm or less, (b) the orientational Ti compound layer contains 35 at % or more of Ti and 30 at % or more of N with respect to a total amount of components configuring the orientational Ti compound, (c) a maximum TC value (TC max) is 2.5 or more at the time of carrying out an X-ray diffraction analysis (2θ-θ scan) on the orientational Ti compound layer and computing individual TC values (orientation index) of seven planes of (111), (200), (220), (311), (331), (420), and (422), and (d) in the case of measuring crystal orientations, in a plane parallel to the surface of the tool body, of crystal grains for which a plane exhibiting the maximum TC value is perpendicular to the surface of the tool body using an X-ray pole figure of the (200) plane in a case where the plane having the maximum TC value of the orientational Ti compound layer is a plane other than (200) or an X-ray pole figure of the (111) plane in a case where the plane having the maximum TC value is (200), a full width at half maximum of $\phi$ scan is 30° or less.

(2) The surface-coated cutting tool according to (1), in which the hard coating layer includes, in addition to the orientational Ti compound layer, one or more layers of a nitride layer of Ti, a carbonitride layer of Ti, and a complex nitride layer of Ti and Al.

(3) The surface-coated cutting tool according to (1) or (2), in which the hard coating layer is formed on a part or all of the surface of the tool body.

(4) The surface-coated cutting tool according to any one of (1) to (3), in which the hard coating layer is formed on at least a flank face on the surface of the tool body.

The carbonitride of Ti mentioned in (2) includes a carbonitride of Ti having a vertically long growth crystal structure (a carbonitride layer of Ti having a crystal structure in a form described in Japanese Unexamined Patent Application, First Publication No. H6-8010). Hereinafter, the carbonitride of Ti having a vertically long growth crystal structure will be represented by "MT-TiCN".

The coated tool of the present invention includes, as the hard coating layer formed on the surface of the tool body, at least one orientational Ti compound layer made of a rock salt-type cubic crystal structure containing predetermined amounts of Ti and N, and, in the case of carrying out an X-ray diffraction analysis on the orientational Ti compound layer, computing TC values for the seven planes of (111), (200), (220), (311), (331), (420), and (422), and measuring the crystal orientations, in a plane parallel to the surface of the tool body, of the crystal grains for which a plane exhibiting the maximum TC value is perpendicular to the surface of the tool body using an X-ray pole figure of the (200) plane or the (111) plane depending on the plane having the maximum TC value, the full width at half maximum of $\phi$ scan is 30° or less, and thus the orientational Ti compound layer has a crystal grain microstructure having a high crystal orientation in the direction perpendicular to the surface of the tool body and in the direction parallel to the surface of the tool body.

Therefore, at least in the orientational Ti compound layer, a number of small angle tilt boundaries are present, and the formation of large angle tilt boundaries is suppressed, and thus, even in the interval cutting of stainless steel, a component of a work material diffuses into grain boundaries to a small extent, consequently, the occurrence of weld chipping and adhesive wear is suppressed, and the service life of the tool is extended.

Furthermore, in the case of forming an additional hard layer on the surface of the orientational Ti compound layer, the additional hard layer is formed in a state of assuming the orientation of the orientational Ti compound layer, and thus the formation of large angle tilt boundaries is suppressed, and excellent weld chipping resistance and adhesive wear resistance are exhibited.

DETAILED DESCRIPTION OF THE INVENTION

Next, an embodiment of a coated tool of the present invention will be described in detail.

In a coated tool of the present embodiment, a hard coating layer including at least one orientational Ti compound layer is formed in a part or all of a surface of a tool body, and the orientational Ti compound layer has a crystal grain microstructure highly oriented in a direction perpendicular to the surface of the tool body (layer thickness direction) and in a direction parallel to the surface of the tool body (tool body in-plane direction).

Hard Coating Layer:

The hard coating layer of the coated tool of the present embodiment includes at least one orientational Ti compound layer which has an average layer thickness of 0.1 µm or more and 10 µm or less and is made of a rock salt-type cubic crystal structure on a part or all of the surface of the tool body. The amount of Ti and the amount of N included in the orientational Ti compound layer are 35 at % or more (Ti) and 30 at % or more (N) with respect to the total amount of components configuring the orientational Ti compound layer. The upper limit value of Ti is 60 at %, and the upper limit value of N is 53 at %.

When the average layer thickness of the orientational Ti compound layers is less than 0.1 µm, the adhesive strength between the surface of the tool body and the hard coating layer is not sufficient, and, on the other hand, when the average layer thickness exceeds 10 µm, plastic deformation easily occurs, which consequently serves as a cause of the occurrence of the dropping of a crystal grain and the occurrence of the resulting chipping, breakage, and peeling or the generation of the resulting abnormal damage such as the progress of uneven wear.

As Ti compound layers other than the orientational Ti compound layer mentioned in the present embodiment, specifically, a layer of a nitride of Ti (represented by TiN) with random orientations and a layer of a carbonitride of Ti (represented by TiCN) with random orientations can be exemplified.

The Ti compound mentioned in the present embodiment refers to a compound made of a rock salt-type cubic crystal structure such as TiN, TiCN, or TiAlN containing 35 at % or more of Ti and 30 at % or more of N.

In addition, the total layer thickness of the hard coating layer of the coated tool of the present embodiment is set to 1 µm or more and 25 µm or less, and this is because, when the total layer thickness is less than 1 µm, it becomes impossible to exhibit excellent wear resistance over long-term use, and, on the other hand, when the total layer thickness exceeds 25 µm, the generation of an abnormal damage such as chipping, breakage, or peeling is caused.

Orientational Ti Compound Layer:

The hard coating layer of the coated tool of the present embodiment includes at least one orientational Ti compound layer, and the layer is formed as an orientational Ti compound layer which is made of a rock salt-type cubic crystal structure containing 35 at % or more of Ti and 30 at % or more of N (for example, an orientational TiN layer or an orientational TiCN layer) and has a crystal grain microstructure highly oriented in a direction perpendicular to the surface of the tool body (layer thickness direction) and in a direction parallel to the surface of the tool body (tool body in-plane direction).

The orientational Ti compound layer is preferably formed immediately above the surface of the tool body; however, in the case of configuring the hard coating layer as a multilayer structure, the orientational Ti compound layer can also be formed as an interlayer of the multilayer structure.

That is, in the case of forming an additional hard coating layer, for example, one or more layers of a different TiN layer, a different TiCN layer, a different MT-TiCN layer, and a different TiAlN layer on the orientational Ti compound layer, it is possible to configure a layer relatively highly oriented compared with the case of random orientations, that is, a hard coating layer that is highly oriented as a whole by having, at least partly, the same orientation as that of the orientations of the orientational Ti compound layer.

In order to say that the orientational Ti compound layer is oriented, first, it is necessary to set the maximum TC value (TC max) to 2.5 or more at the time of carrying out an X-ray diffraction analysis (2θ-θ scan) on crystal grains configuring the orientational Ti compound layer and computing the TC values for seven individual lattice planes of (111), (200), (220), (311), (331), (420), and (422). The maximum TC value is preferably 4.0 to 7.0, and more preferably a high value.

The reason for TC max being 2.5 or more is that any plane of the seven lattice planes is 2.5 times or more orientated in the direction perpendicular to the surface of the tool body (layer thickness direction) than the case of random orientations.

In the present embodiment, in the case of measuring the crystal orientations, in a plane parallel to the surface of the tool body, of crystal grains for which a plane exhibiting the maximum TC value is perpendicular to the surface of the tool body, using the X-ray pole figure of the (200) plane or the (111) plane depending on the plane having the maximum TC value, the full width at half maximum of φ scan needs to be 30° or less.

The crystal orientations in the plane parallel to the surface of the tool body of the crystal grains for which the plane exhibiting the maximum TC value is perpendicular to the surface of the tool body are measured using the X-ray pole figure of the (200) plane in a case where the plane having the maximum TC value is a plane other than (200) or the X-ray pole figure of the (111) plane in a case where the plane having the maximum TC value is (200).

The fact that the X-ray diffraction intensity has a peak in φ scan in the case of measuring the crystal orientations in the plane parallel to the surface of the tool body for the crystal grains for which the plane having the maximum TC value is perpendicular to the surface of the tool body (that is, crystal grains oriented in the film thickness direction) refers to the fact that the crystal grains oriented in the film thickness direction are also oriented in a direction parallel to the surface of the tool body.

As a result, in the layer thickness direction of the orientational Ti compound layer, a relatively larger number of small angle tilt boundaries are formed compared with the case of random orientations, and consequently, even in the interval cutting of stainless steel, a component of a work material diffuses into grain boundaries to a small extent, and the occurrence of weld chipping and adhesive wear is suppressed.

Here, the TC(hkl) value can be computed from Expression (1).

[Expression 1]

$$Tc(hkl) = \frac{I(hkl)}{I_0(hkl)} \left\{ \frac{1}{7} \Sigma \frac{I(hkl)}{I_0(hkl)} \right\}^{-1} \quad (1)$$

In the expression (1), I(hkl) represents the X-ray diffraction peak intensity of a measured (hkl) plane, and $I_0$(hkl) represents the standard X-ray diffraction peak intensity of TiN having an ICDD card reference code of 01-087-0627.

In addition, (hkl) indicates the seven planes of (111) (200), (220), (311), (331), (420), and (422).

The orientational Ti compound layer is a compound made of a rock salt-type cubic crystal structure containing 35 at % or more of Ti and 30 at % or more of N and includes, for example, Al, Zr, Cr, Co, B, C, O, or Cl as an additive or an impurity in some cases. Therefore, strictly speaking, in some cases, the orientational Ti compound layer is not TiN, but includes Ti and N as main components and has a rock salt-type cubic crystal structure, and thus, even in a case where a film is randomly oriented, the peak intensity ratio is not considered to significantly deviate from the peak intensity ratio of TiN having an ICDD card reference code of 01-087-0627, and thus the TC value was computed using the above-described expression (1).

In the X-ray diffraction analysis, PANalytical Empyrean by Spectris is used as an X-ray diffractometer, the intensities are measured by a 2θ-θ method in which a Cu K-alpha X-ray is used, the measurement conditions are a measurement range (2θ) of 30 to 130 degrees, an X-ray output of 45 kV, 40 mA, a divergence slit of 0.5 degrees, a scan step of 0.013 degrees, and a measurement time per step of 0.48 sec/step, and X-ray diffraction peak intensities I(hkl) are obtained.

However, there are cases where the intensities of diffraction peaks from the orientational Ti compound layer cannot be sufficiently obtained, for example, a case where the film thickness of a film formed above the orientational Ti compound layer exceeds 10 μm. In such a case, it is also possible to carry out an XRD diffraction analysis using the above-described method after partially removing the film formed above by mechanical polishing, ion milling, or the like.

The orientation in the layer thickness direction can be enhanced by setting the TC max to 2.5 or more; however, in order to obtain a film having a crystal grain microstructure with a number of small angle tilt boundaries, it is necessary to form a crystal orientation in the direction parallel to the surface of the tool body (tool body in-plane direction).

Regarding the orientation in the direction parallel to the surface of the tool body (tool body in-plane direction), in the case of measuring the crystal orientations, in a plane parallel to the surface of the tool body, of crystal grains for which a plane exhibiting the maximum TC value, out of the TC values of the seven individual lattice planes of (111) (200), (220), (311), (331), (420), and (422) measured above, is perpendicular to the surface of the tool body using the X-ray pole figure of the (200) plane in a case where the plane having the maximum TC value is a plane other than (200) or the X-ray pole figure of the (111) plane in a case where the plane having the maximum TC value is (200), the full width at half maximum of ϕ scan needs to be 30° or less.

The fact that the full width at half maximum is 30° or less indicates that the crystal grains are oriented not only in the direction perpendicular to the surface of the tool body (layer thickness direction) but also in the direction parallel to the surface of the tool body (tool body in-plane direction), whereby it is confirmed that the crystal grains of the orientational Ti compound layer are oriented in both the layer thickness direction and the tool body in-plane direction.

In addition, the above-described fact shows that the orientational Ti compound layer is made of a crystal grain microstructure including a small number of large angle tilt boundaries and, relatively, a large number of small angle tilt boundaries, and consequently, the coated tool of the present embodiment having the above-described hard coating layer suppresses the occurrence of weld chipping and adhesive wear in the interval cutting process of stainless steel that is a difficult-to-cut material and thus shows excellent chipping resistance and wear resistance and exhibits excellent cutting performance over long-term use.

Formation of orientational Ti compound layer:

The orientational Ti compound layer oriented in both the layer thickness direction and the tool body in-plane direction in the present embodiment can be formed, for example, as follows.

First, in order to enhance the orientation of the Ti compound layer, a smoothing treatment of the surface of the tool body is carried out.

Specifically, elastic media composited with abrasive particles are sprayed, thereby smoothing the surface of a flank face of the tool body such that the surface roughness (Ra) reaches 0.2 μm or less.

Next, a film is formed using a non-equilibrium magnetron sputtering device in a state in which, for example, the flank face is set at a slope of 52.5° relative to the incident angle of plasma, and a Ti compound layer having a predetermined layer thickness is formed, thereby forming the orientational Ti compound layer.

It is confirmed that, in the flank face, the orientational Ti compound layer formed on the surface of the flank face is oriented in the direction perpendicular to the surface of the tool body and, at the same time, is also oriented in the tool body in-a plane direction.

Figure 1:
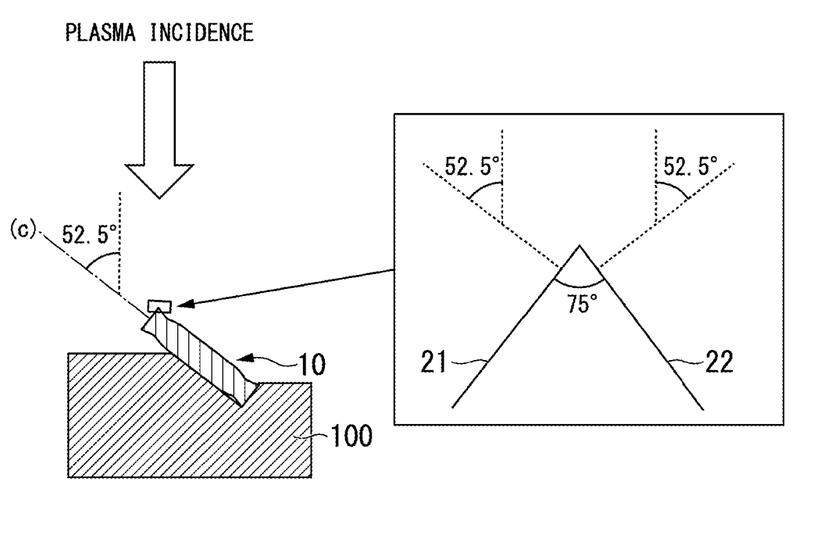
The drawing is a schematic pattern diagram showing a relative positional relationship between an incident direction of plasma from a non-equilibrium magnetron sputtering device and a cutting edge face of a tool body at the time of forming an orientational Ti compound layer of a coated tool of the present invention and a partial enlarged view thereof.

In one embodiment, as shown in the drawing, when the tool body 10 is set to a fixing jig 100 in the non-equilibrium magnetron sputtering device, a flank face 21 of a main cutting edge is inclined, so as to have an angle of 52.5° between a central axis C of the tool body 10 which is perpendicular to the flank face 21 of the tool body 10 and an incident direction of the plasma.

Further, when an angle between the flank face 21 of the main cutting edge and a land portion 22 in a rake face of the main cutting edge is 75°, an angle between a vertical line which is perpendicular to the land portion 22 in the rake face of the main cutting edge and the incident direction of the plasma has 52.5°. That is, the land portion 22 in the rake face of the main cutting edge may have the orientational Ti compound layer which is similar to the flank face 21 of the main cutting edge.

Formation of Hard Coating Layer:

The tool body on which the orientational Ti compound layer has been formed is removed from the non-equilibrium magnetron sputtering device, and an MT-TiCN layer is formed, for example, as a hard layer using the CVD method on the surface of the orientational Ti compound layer, whereby it is possible to form a hard coating layer made up of the orientational Ti compound layer and the MT-TiCN layer on the surface of the tool body.

In addition, it is also possible to form an orientational TiCN layer on the surface of the tool body by annealing the tool body including the orientational Ti compound layer at 1,070° C. for two hours in a hydrogen atmosphere to form orientational TiCN by the diffusion of C into an orientational TiN layer from the tool body.

In addition, it is also possible to form a hard coating layer made up of the orientational Ti compound layer and a TiAlN layer on the surface of the tool body by removing the tool body on which the orientational Ti compound layer has been formed from the non-equilibrium magnetron sputtering device and forming the TiAlN layer as a hard layer using the CVD method on the surface of the orientational Ti compound layer.

Even in any of the above-described cases where the surface of the orientational Ti compound layer is coated with an additional hard layer, the additional hard layer has, at least partly, the same orientation as that of the orientational Ti compound layer (in other words, the additional hard layer is epitaxially grown on the orientational Ti compound layer), and the formation of large angle tilt boundaries in an additional hard layer also decreases, and thus the weld chipping resistance and the adhesive wear resistance improve throughout the entire hard coating layer.

EXAMPLES

Hereinafter, examples of the coated tool of the present invention will be specifically described.

As raw material powders, WC powder, TiC powder, $Cr_3C_2$ powder, TiN powder, and Co powder each having an average grain diameter of 1 to 3 µm were prepared, these raw material powders were blended together according to a formulation shown in Table 1, furthermore, wax was added thereto and mixed therewith in acetone for 24 hours using a ball mill, the mixture was dried under reduced pressure and then pressed at a pressure of 98 MPa to a green compact having a predetermined shape, this green compact was vacuum-sintered under conditions of being held in a vacuum of 5 Pa at a predetermined temperature in a range of 1,370° C. to 1,470° C. for one hour, and then the outer circumference was polished, thereby manufacturing a WC-based cemented carbide tool body A having an insert shape of CNGG120404-PK (manufactured by Mitsubishi Materials Corporation).

In addition, as raw material powders, TiCN (mass ratio TiC/TiN=50/50) powder, NbC powder, TaC powder, $Mo_2C$ powder, WC powder, Co powder, and Ni powder each having an average grain diameter of 0.5 to 2 µm were prepared, these raw material powders were blended together according to a formulation shown in Table 1, wet-mixed using a ball mill for 24 hours, dried, and then pressed at a pressure of 98 MPa to a green compact, this green compact was sintered under conditions of being held in a nitrogen atmosphere of 1.3 kPa at a temperature of 1,500° C. for one hour, and then the outer circumference was polished, thereby producing a TiCN-based cermet tool body B having an insert shape of CNGG120404-PK (manufactured by Mitsubishi Materials Corporation).

Next, a smoothing treatment was carried out on the surfaces of the tool body A and the tool body B under the following conditions, and the surface roughness Ra of at least the flank face was set to 0.2 µm or less.

<Smoothing Treatment Conditions>

In the smoothing treatment, an elastic polishing agent (SIRIUS Z media manufactured by Fuji Manufacturing Co., Ltd.) was projected using an air. The air pressure was 0.35 MPa, and the treatment was carried out until the surface roughness Ra reached 0.2 µm or less.

Next, the smoothened tool body A and tool body B were charged into a non-equilibrium magnetron sputtering device, and deposition was carried out under conditions shown in Table 2, thereby forming an orientational Ti compound layer having a target layer thickness shown in Table 4 by deposition.

The drawing shows the installation mode of the tool body A and the tool body B.

That is, as shown in the drawing, the film was formed in a state in which "the flank face (the flank face 21) configuring the main cutting edge during a cutting process" was inclined at an angle of 52.5° relative to the incident angle of plasma and in a state in which "the land portion (the land portion 22) of the rake face configuring the main cutting edge during the cutting process" was inclined at an angle of 52.5° relative to the incident angle of plasma at the time of setting the tool body A and the tool body B.

Next, as a hard layer, a Ti compound layer, TiAlN layer, or the like having a target layer thickness was further formed by deposition under CVD conditions shown in Table 3, thereby producing invention coated tools 1 to 4 shown in Table 4.

In the invention coated tools 1 to 4, a TiN layer was formed by deposition as the orientational Ti compound layer using the non-equilibrium magnetron sputtering device.

In addition, after a TiN layer was formed by deposition on the tool body A using the non-equilibrium magnetron sputtering device, the TiN layer was and then annealed at 1,070° C. for two hours in a hydrogen atmosphere to form orientational TiCN by the diffusion of C into the orientational TiN layer from the tool body, thereby forming an orientational TiCN layer on the surface of the tool body. Next, as a hard layer, a Ti compound layer or the like having a target layer thickness was further formed by deposition under the CVD conditions shown in Table 3, thereby producing invention coated tools 5 and 6 shown in Table 4.

For the purpose of comparison, each of the tool body A and the tool body B that were surface-smoothened under the above-described conditions was charged into the non-equilibrium magnetron sputtering device, deposition was carried out under comparative example conditions shown in Table 2, an orientational Ti compound layer having a target layer thickness shown in Table 5 was formed by deposition, next, the tool body was charged into an ordinary chemical deposition device, and, as a hard layer, a Ti compound layer or TiAlN layer having a target layer thickness shown in Table 5 was formed by deposition under the CVD conditions shown in Table 3, thereby manufacturing comparative example coated tools 1 to 4 shown in Table 5.

In addition, the tool body A was charged into the ordinary chemical deposition device, and, as a hard layer, a Ti compound layer having a target layer thickness shown in Table 5 was formed by deposition under the CVD conditions shown in Table 3, thereby manufacturing a comparative example coated tool 5 shown in Table 5.

For the orientational Ti compound layers in the invention coated tools 1 to 6, the orientational Ti compound layers in the comparative example coated tools 1 to 4, and the TiN layer in the comparative example coated tool 5, the diffraction peak intensities from individual lattice planes of (111), (200), (220), (311), (331), (420), and (422) were measured by X-ray diffraction.

For X-ray diffraction analyses and X-ray pole figures described below, the flank face was mechanically polished in advance until the second layer (that is, TiCNO in the case of the invention tool 1) of the hard layer on the flank face wore, and then measurement was carried out on the flank face.

In the X-ray diffractions, PANalytical Empyrean by Spectris was used as a device, the intensities were measured by a 2θ-θ method in which a Cu K-alpha X-ray was used.

The measurement conditions were a measurement range (2θ) of 30 to 130 degrees, an X-ray output of 45 kV, 40 mA, a divergence slit of 0.5 degrees, a scan step of 0.013 degrees, and a measurement time per step of 0.48 sec/step.

Next, TC values for the individual lattice planes were computed on the basis of the measurement results of the diffraction peak intensities and Expression (1), and, furthermore, the maximum TC value was obtained as TC max.

[Expression 2]

$$Tc(hkl) = \frac{I(hkl)}{I_0(hkl)} \left\{ \frac{1}{7} \Sigma \frac{I(hkl)}{I_0(hkl)} \right\}^{-1} \quad (1)$$

In the expression (1), I(hkl) represents the X-ray diffraction peak intensity of a measured (hkl) plane, and $I_0$(hkl) represents the standard X-ray diffraction peak intensity of TiN having an ICDD card reference code of 01-087-0627.

In addition, (hkl) indicates the seven planes of (111), (200), (220), (311), (331), (420), and (422).

The values of TC max computed above and the corresponding lattice planes are shown in Table 4 and Table 5.

For the TiN layer that was the hard layer in the comparative example coated tool 5 as well, for reference, the value of TC max and the corresponding lattice plane were obtained using the same measurement and computation methods as described above and are shown in Table 5 as reference values.

The diffraction peak intensities and the TC values of the individual lattice planes measured and computed for the invention coated tool 1 are shown in Table 6.

Next, for the crystal orientations, in a plane parallel to the surface of the tool body, of crystal grains for which the (111) plane was perpendicular to the surface of the tool body, the full width at half maximum of φ scan was obtained using the X-ray pole figure of the (200) plane.

The values of the full width at half maximum obtained above are shown in Table 4 and Table 5.

For the TiN layer that was the hard layer in the comparative example coated tool 5 as well, for reference, the same measurement and computation as described above were carried out, and the full width at half maximum is shown in Table 5 as a reference value.

In addition, the thicknesses of the respective configurational layers of the hard coating layers of the invention coated tools 1 to 6 and the comparative example coated tools 1 to 5 were measured (longitudinal section measurement) using a scanning electron microscope, and all of the thicknesses exhibited an average layer thickness (average value of thicknesses measured at five points) that was substantially the same as the target layer thickness.

TABLE 1

| Type | Formulation (mass %) | | | | | | | | |
|---|---|---|---|---|---|---|---|---|---|
| | Co | Ni | TiC | TiN | NbC | TaC | $Mo_2C$ | $Cr_3C_2$ | TiCN | WC |
| Tool body A | 8.0 | — | 1.2 | 1.2 | — | — | — | 0.5 | — | Balance |
| Tool body B | 12.0 | 3.0 | — | — | 4.0 | 1.0 | 9.5 | — | Balance | 10 |

(Note)
The WC column for the tool body A and the TiCN column for the tool body B include an inevitable impurity.

TABLE 2

Non-equilibrium magnetron sputtering conditions

| Type of sputtering conditions | Gas composition | Pressure (Pa) | Tool body temperature (° C.) | Bias voltage (V) | Inclination angle of flank face of tool body with respect to plasma incidence angle (degrees) |
|---|---|---|---|---|---|
| Invention conditions A | $N_2$: 10%, Ar: balance | 0.5 | 200 | 10 | 52.5 |
| Comparative example conditions B | $N_2$: 10%, Ar: balance | 0.5 | 200 | 10 | 0.0 |

TABLE 3

Formation conditions (the unit of the pressure is kPa, and the unit of the temperature is ° C.)

| Type of hard layer | Formation sign | Reaction gas composition (vol %) | Reaction atmosphere | |
|---|---|---|---|---|
| | | | Pressure | Temperature |
| TiN layer | TiN | $TiCl_4$: 5%, $N_2$: 30%, $H_2$: balance | 20 | 900 |
| TiC layer | TiC | $TiCl_4$: 5%, $CH_4$: 10%, $H_2$: balance | 7 | 1020 |
| MT-TiCN layer | MT-TiCN | $TiCl_4$: 4%, $CH_4$: 1%, $N_2$: 25%, $H_2$: balance | 10 | 1000 |
| TiCNO layer | TiCNO | $TiCl_4$: 4%, CO: 2%, CH4: 2%, $N_2$: 10%, $H_2$: balance | 30 | 950 |
| α-$Al_2O_3$ layer | α-$Al_2O_3$ | $AlCl_3$: 2.2%, $CO_2$: 6.5%, HCl: 2.2%, $H_2S$: 0.2%, $H_2$: balance | 7 | 1000 |
| κ-$Al_2O_3$ layer | κ-$Al_2O_3$ | $AlCl_3$: 3.0%, $CO_2$: 5.0%, $H_2S$: 0.3%, $H_2$: balance | 7 | 970 |
| TiAlN layer | TiAlN | $NH_3$: 1.5%, $TiCl_4$: 0.15%, $AlCl_3$: 0.6%, $N_2$: 2%, $H_2$: balance | 5 | 800 |

TABLE 4

| Type | | Tool body sign | Type of sputtering conditions | Orientational Ti compound layer | | | | | | | Layer type and layer thickness (μm) of hard layer | | | Target average total layer thickness (μm) |
|---|---|---|---|---|---|---|---|---|---|---|---|---|---|---|
| | | | | Layer type | Amount of Ti (at %) | Amount of N (at %) | Target average layer thickness (μm) | Lattice plane having TCmax | Value of TCmax | Full width at half maximum of X-ray diffraction peak intensity of plane parallel to surface of tool body (degrees) | First layer | Second layer | Third layer | |
| Invention coated tool | 1 | A | A | TiN | 49 | 48 | 1.0 | (111) | 5.34 | 19 | MT-TiCN (3.0) | TiCNO (0.2) | α-Al$_2$O$_3$ (1.0) | 5.2 |
| | 2 | B | A | TiN | 48 | 48 | 1.0 | (111) | 5.50 | 21 | MT-TiCN (3.0) | TiN (0.2) | AlTiN (1.0) | 5.2 |
| | 3 | A | A | TiN | 49 | 48 | 0.6 | (111) | 4.81 | 21 | MT-TiCN (3.0) | TiN (0.2) | None | 3.8 |
| | 4 | B | A | TiN | 48 | 47 | 0.6 | (111) | 4.87 | 23 | MT-TiCN (3.0) | TiCNO (0.2) | κ-Al$_2$O$_3$ (1.0) | 4.8 |
| | 5 | A | A | TiCN | 48 | 39 | 1.0 | (111) | 3.23 | 26 | TiC (1.5) | MT-TiCN (2.0) | α-Al$_2$O$_3$ (1.0) | 5.5 |
| | 6 | A | A | TiCN | 48 | 38 | 1.0 | (111) | 2.92 | 28 | TiC (1.5) | MT-TiCN (2.0) | TiN (1.0) | 5.5 |

(Note)
Numerical values in parentheses for the hard layer indicate the target average layer thicknesses (μm) of the respective layers.

TABLE 5

| Type | | Tool body sign | Type of sputtering conditions | Orientational Ti compound layer | | | | | | | Layer type and layer thickness (μm) of hard layer | | | Target average total layer thickness (μm) |
|---|---|---|---|---|---|---|---|---|---|---|---|---|---|---|
| | | | | Layer type | Amount of Ti (at %) | Amount of N (at %) | Target average layer thickness (μm) | Lattice plane having TCmax | Value of TCmax | Full width at half maximum of X-ray diffraction peak intensity of plane parallel to surface of tool body (degrees) | First layer | Second layer | Third layer | |
| Comparative example coated tool | 1 | A | B | TiN | 49 | 48 | 1.0 | (111) | 5.83 | No peak | MT-TiCN (3.0) | TiCNO (0.2) | α-Al$_2$O$_3$ (1.0) | 5.2 |
| | 2 | A | B | TiN | 49 | 48 | 1.0 | (111) | 5.74 | No peak | MT-TiCN (3.0) | TiN (0.2) | AlTiN (1.0) | 5.2 |
| | 3 | B | B | TiN | 48 | 48 | 1.0 | (111) | 5.88 | No peak | MT-TiCN (3.0) | TiCNO (0.2) | α-Al$_2$O$_3$ (1.0) | 5.2 |
| | 4 | B | B | TiN | 48 | 47 | 1.0 | (111) | 5.76 | No peak | MT-TiCN (3.0) | TiN (0.2) | AlTiN (1.0) | 5.2 |
| | 5 | A | None | TiN | 49 | 45 | 1.0 | (420) | 1.43 | No peak | TiN (1.0) | MT-TiCN (3.0) | None | 5.0 |

(Note 1)
Values in the columns for the orientational Ti compound layer of the comparative example tool 5 are reference values measured for TiN in the hard layer.
(Note 2)
Numerical values in parentheses for the hard layer indicate the target average layer thicknesses (μm) of the respective layers.

TABLE 6

| Plane index | XRD peak intensity ratio | TC value |
|---|---|---|
| (111) | 0.909 | 5.34 |
| (200) | 0.022 | 0.09 |
| (220) | 0.030 | 0.28 |
| (311) | 0.026 | 0.64 |
| (331) | 0.003 | 0.23 |
| (420) | 0.002 | 0.07 |
| (422) | 0.008 | 0.35 |

Next, for the variety of coated tools of the invention coated tools 1 to 6 and the comparative example coated tools 1 to 5, an interval cutting test of stainless steel was carried out in a state in which all of the coated tools were screwed to the front end section of a tool steel cutting tool using a fixing jig.

The cutting conditions were as described below.
Work material: JIS•SUS304 round bar,
Cutting speed: 140 m/min,
Depth of cut: 0.90 mm
Feed: 0.15 mm/rev.

One hundred passes of interval cutting under a condition of one path being three-second cutting and three-second break The flank face wear width (not including a boundary damage portion) of the cutting edge after the interval cutting test was measured, and the occurrence status of abnormal damage such as chipping, breakage, or peeling was visually observed.

The test results are shown in Table 7.

TABLE 7

| Type | | Flank face wear width (mm) | Presence or absence of occurrence of abnormal damage such as weld chipping and adhesive wear | Type | | Flank face wear width (mm) | Presence or absence of occurrence of abnormal damage such as weld chipping and adhesive wear |
|---|---|---|---|---|---|---|---|
| Invention coated tool | 1 | 0.11 | Absent | Comparative example coated tool | 1 | ✗30 | Present |
| | 2 | 0.15 | Absent | | 2 | ✗37 | Present |
| | 3 | 0.16 | Absent | | 3 | ✗43 | Present |
| | 4 | 0.13 | Absent | | 4 | ✗22 | Present |
| | 5 | 0.12 | Absent | | 5 | ✗51 | Present |
| | 6 | 0.16 | Absent | | | | |

(✗-sign in the column for the comparative example coated tool indicates the number of passes carried out until the service life ends due to the occurrence of abnormal damage.)

The results shown in Table 7 show that, in the invention coated tools 1 to 6, the orientational Ti compound layer of the hard coating layer had a crystal grain microstructure having a high crystal orientation in the direction perpendicular to the surface of the tool body and in the direction parallel to the surface of the tool body, the formation of large angle tilt boundaries was suppressed, furthermore, even in the additional hard layer formed on the orientational Ti compound layer, the additional hard layer had, at least partly, the same orientation as that of the orientational Ti compound layer (in other words, the additional hard layer is epitaxially grown on the orientational Ti compound layer), which suppressed the formation of large angle tilt boundaries, and thus the occurrence of abnormal damage such as weld chipping and adhesive wear was suppressed, and excellent chipping resistance and wear resistance were exhibited over long-term use.

In contrast, in the comparative example coated tools 1 to 5, due to the occurrence of weld chipping during the interval cutting, and thus the cutting edge broke within a relatively short period of time, and the service life ended.

INDUSTRIAL APPLICABILITY

As described above, the coated tool of the present invention exhibits particularly excellent cutting performance in the interval cutting of stainless steel, but it is needless to say that the coated tool is also applicable to the continuous cutting or intermittent cutting of a variety of steels or cast ions other than stainless steel.

What is claimed is:

1. A surface-coated cutting tool comprising:
   a tool body made of tungsten carbide-based cemented carbide or a titanium carbonitride-based cermet; and
   a hard coating layer having a total layer thickness of 1 μm or more and 25 μm or less formed on a surface of the tool body, wherein
   (a) the hard coating layer includes at least one Ti compound layer which is made of a rock salt-type cubic crystal structure and which has an average layer thickness of 0.1 μm or more and 10 μm or less, said Ti compound layer having a crystal grain microstructure oriented with respect to the surface of the tool body,
   (b) the Ti compound layer contains 35 at % or more of Ti and 30 at % or more of N with respect to a total amount of components configuring the Ti compound,
   (c) a maximum TC value (TCmax) is 2.5 or more in an X-ray diffraction analysis (2θ-θ scan) on the Ti compound layer where TC values of seven planes of (111), (200), (220), (311), (331), (420), and (422) are computed, each of the TC values being an orientation index computed from an expression 1) below:

$$Tc(hkl) = \frac{I(hkl)}{I_0(hkl)} \left\{ \frac{1}{7} \sum \frac{I(hkl)}{I_0(hkl)} \right\}^{-1} \quad (1)$$

where I(hkl) represents an X-ray diffraction peak intensity of a measured (hkl) plane, and $I_0$(hkl) represents a standard X-ray diffraction peak intensity of TiN having an ICDD card reference code of 01-087-0627, (hkl) indicates the seven planes of (111) (200), (220), (311), (331), (420), and (422), and
   (d) a full width at half maximum of a peak in a φ scan is 30° or less, the peak being obtained by measuring orientations of crystal grains in a plane parallel to the surface of the tool body, said crystal grains belonging to a plane exhibiting the maximum TC value and being oriented in a direction perpendicular to the surface of the tool body, wherein
   an X-ray pole figure of a (200) plane is used to measure the orientations of the crystal grains when the plane exhibiting the maximum TC value is any one of the planes (111), (220), (311), (331), (420), or (422), and
   an X-ray pole figure of a (111) plane is used to measure the orientations of the crystal grains when the plane exhibiting the maximum TC value is the (200) plane, wherein the TCmax is measured by using an X-ray diffractometer, X-ray diffraction peak intensities are measured by a 2θ-θ method in which a Cu K-alpha X-ray is used, in conditions where a measurement range (2θ) is 30 to 130 degrees, an X-ray output is 45 kV, 40 mA, a divergence slit is 0.5 degrees, a scan step is 0.013 degrees, and a measurement time per step is 0.48 sec/step, wherein the hard coating layer is formed by: smoothing a surface of a flank face of the tool body to a surface roughness (Ra) of 0.2 μm or less, and depositing a film by using a non-equilibrium magnetron sputtering device on the tool body in a condition where the flank face is tilted with respect to an incident angle of plasma.

2. The surface-coated cutting tool according to claim 1, wherein the hard coating layer includes, in addition to the Ti compound layer, one or more layers of a nitride layer of Ti, a carbonitride layer of Ti, and a complex nitride layer of Ti and Al.

3. The surface-coated cutting tool according to claim 1, wherein the hard coating layer is formed on a part or all of the surface of the tool body.

4. The surface-coated cutting tool according to claim 1, wherein the hard coating layer is formed on at least a flank face on the surface of the tool body.

5. The surface-coated cutting tool according to claim 2, wherein the hard coating layer is formed on a part or all of the surface of the tool body.

6. The surface-coated cutting tool according to claim 2, wherein the hard coating layer is formed on at least a flank face on the surface of the tool body.

7. The surface-coated cutting tool according to claim 3, wherein the hard coating layer is formed on at least a flank face on the surface of the tool body.

8. The surface-coated cutting tool according to claim 5, wherein the hard coating layer is formed on at least a flank face on the surface of the tool body.

9. The surface-coated cutting tool according to claim 1, wherein the TCmax is 2.5 or more and 7.0 or less.

* * * * *